United States Patent [19]

Djennas et al.

[11] Patent Number: 5,734,201
[45] Date of Patent: Mar. 31, 1998

[54] LOW PROFILE SEMICONDUCTOR DEVICE WITH LIKE-SIZED CHIP AND MOUNTING SUBSTRATE

[75] Inventors: Frank Djennas; Wilhelm Sterlin; Bennett A. Joiner, Jr., all of Austin, Tex.

[73] Assignee: Motorola, Inc., Schaumburg, Ill.

[21] Appl. No.: 328,978

[22] Filed: Oct. 21, 1994

Related U.S. Application Data

[63] Continuation of Ser. No. 149,499, Nov. 9, 1993, abandoned.

[51] Int. Cl.$^6$ ........................ H01L 23/48
[52] U.S. Cl. .................. 257/783; 257/704; 257/684; 257/778
[58] Field of Search .................. 257/778, 796, 257/698, 783, 704, 680, 687, 684, 697

[56] References Cited

U.S. PATENT DOCUMENTS

| | | | |
|---|---|---|---|
| 4,276,558 | 6/1981 | Ho et al. | 257/704 |
| 4,514,752 | 4/1985 | Engel et al. | 257/704 |
| 4,811,081 | 3/1989 | Lyden | 257/783 |
| 4,903,118 | 2/1990 | Iwade | 357/72 |
| 5,136,365 | 8/1992 | Pennisi et al. | 257/783 |
| 5,140,405 | 8/1992 | King et al. | 357/67 |
| 5,147,210 | 9/1992 | Patterson et al. | 439/91 |
| 5,183,969 | 2/1993 | Odashima | 174/88 |
| 5,216,278 | 6/1993 | Lin et al. | 257/688 |
| 5,311,059 | 5/1994 | Banerji et al. | 257/697 |
| 5,319,242 | 6/1994 | Carney et al. | 257/680 |

FOREIGN PATENT DOCUMENTS 0368262  5/1990  European Pat. Off. .

*Primary Examiner*—Jerome Jackson
*Assistant Examiner*—Nathan K. Kelley

[57] ABSTRACT

A low profile semiconductor device (24) is manufactured by mounting a semiconductor die (26) onto a substrate (28) using an interposer (30). The interposer couples an active surface (32) of the die (26) to conductive traces (33) on the top surface of the substrate. The interposer is directionally conductive so that electrical conductivity is limited to the z-direction through thickness of the interposer. The interposer both affixes the die to the substrate and provides the first level of interconnects for the device. The inactive surface (36) of the die can be exposed for efficient thermal dissipation. An optional heat spreader (50) may be added for increased thermal management. The device may be overmolded, glob-topped, capped, or unencapsulated. Separate die-attach and wire bonding processes are eliminated. A second level of interconnects are provided by either solder balls (38), solder columns (44), or pins (64).

3 Claims, 2 Drawing Sheets

LOW PROFILE SEMICONDUCTOR DEVICE WITH LIKE-SIZED CHIP AND MOUNTING SUBSTRATE

This application is a continuation of prior application Ser. No. 08/149,499, filed Nov. 9, 1993, now abandoned.

FIELD OF THE INVENTION

The present invention relates to a semiconductor device in general, and more specifically to a semiconductor device having first level of interconnects through an interposer and a method for making the same.

BACKGROUND OF THE INVENTION

Continuous advances in the electronics industry create the ongoing need to improve electrical, mechanical and thermal performances of packaged semiconductor devices. Additionally, the proliferation of uses for semiconductor devices in consumer electronic goods gives rise to a constant effort to reduce packaging costs of semiconductor dice to provide cost effective and cost competitive products on the market. One of the trends in the electronics industry is miniaturization. Products are becoming thinner and smaller while performing more complicated functions. Therefore, the size of a packaged semiconductor device is important, both in the x-y direction in correlation to the device's footprint, and in the z-direction in correlation to the profile or height of the package.

The pad array carrier offers advantages in size, lead count, and pitch over other conventionally molded semiconductor packages, such as plastic leaded chip carrier (PLCC) and quad flat pack (QFP). FIG. 1 illustrates, in cross-section, an overmolded semiconductor device 10 as known in the prior art. The device 10 uses a die-attach epoxy 14 to hold a semiconductor die 16 in place and a plurality of wire bonds 18 as the first level of interconnects from the die 16 to the substrate 20. A plurality of solder balls 22, attached to the backside of the substrate 20, and electrically connected to the topside of the mounting substrate 20 through vias 23, provide a second level of interconnects from the device 10 to a board (not shown).

A disadvantage of the semiconductor device 10 is the use of epoxy die-attach 14 which occupies valuable substrate space. The area directly underneath the die 16 on the top surface of the substrate cannot be used for placement of signal traces. Another disadvantage to the prior art configuration is that the die-attach epoxy 14 is typically a major factor in package delamination and cracking. Additionally, the structure has poor heat dissipation because the heat must be conducted through the die-attach epoxy into the substrate 20 or through the resin package body 21 to the top of the package.

An alternate solution to the pad array carrier to provide a small size packaged semiconductor device is direct chip attach or flip-chip bonding. In flip-chip bonding, the semiconductor die is provided on its active surface with a plurality of interconnect bumps. These interconnect bumps are soldered to a board. However, flip-chip bonding is expensive to perform, and not all electronics manufacturers are equipped to handle flip-chip bonding. The alignment between the semiconductor die to be flip-chip bonded to a board is critical to ensure good bonds. The type of equipment needed to perform flip-chip bonding is specialized and expensive. Furthermore, flip-chip bonding does not currently allow the semiconductor die to be fully tested and burned-in prior to being mounted to a board.

SUMMARY OF THE INVENTION

The invention provides in one embodiment, a low profile semiconductor device having first level of interconnects through an interposer. The semiconductor device has a mounting substrate, a semiconductor die, an interposer, a resin package body, and a plurality of external electrical connections. The mounting substrate has a die mounting area and a pattern of conductive traces on a first surface, wherein the pattern of conductive traces extend into the die mounting area. The mounting substrate also has a plurality of conductive pads on a second surface of the substrate, wherein the pads are electrically connected to the traces on the first surface. The semiconductor die is mounted on the die mounting area of the mounting substrate. The interposer adhesively and electrically couples an active surface of the semiconductor die to the pattern of conductive traces to provide a first level of interconnects between the active surface of the semiconductor die and the pattern of conductive traces. The resin package body surrounds the semiconductor die and the interposer to mechanically protect the semiconductor die and the first level of interconnects. The plurality of external electrical connections is connected to the plurality of conductive pads on the second surface of the mounting substrate to provide a second level of interconnects.

The invention also provides a method for making low profile semiconductor device having a first level of interconnects through an interposer. A mounting substrate having a die mounting area and a plurality of conductive traces on a first surface and a plurality of conductive pads on a second surface is provided. The plurality of conductive traces extend into the die mounting area of the mounting substrate and is electrically connected to the plurality of conductive pads. A semiconductor die is attached, active side down, on the die mounting area to the plurality of conductive traces with a directionally conductive interposer to form a first level of interconnects. A protective cover is placed around the semiconductor die and the directionally conductive interposer to provide mechanical protection. A plurality of external electrical connections is attached to the plurality of conductive pads to provide a second level of interconnects.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

BRIEF DESCRIPTION OF THE DRAWINGS

The various views illustrate many of the same or similar elements in different embodiments of the invention. Therefore, like numerals are used to designate substantially same or similar elements in the figures.

DETAILED DESCRIPTION OF A PREFERRED EMBODIMENT

Figure 1:
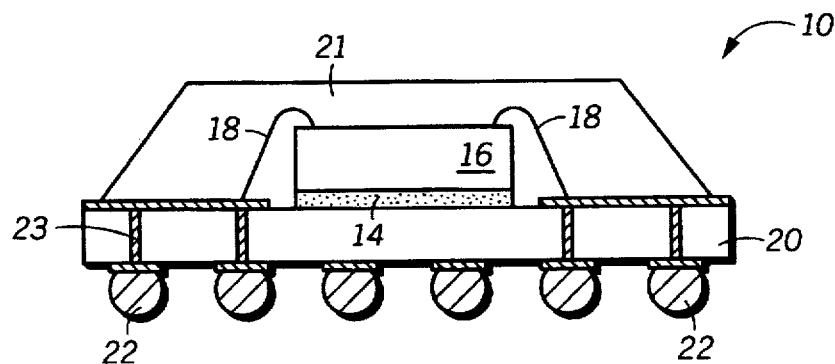
FIG. 1 illustrates, in cross-section, an overmolded semiconductor device as known in the prior art.
Figure 2:
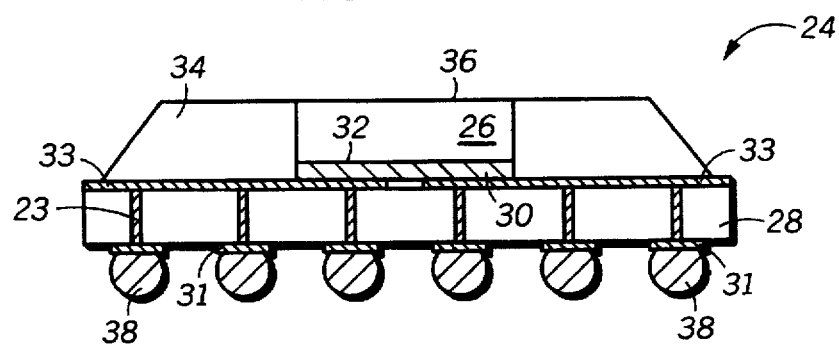
FIG. 2 illustrates, in cross-section, a semiconductor device having an interposer as a first level interconnect, in a first embodiment of the invention.

FIG. 2 illustrates, in cross-section, a semiconductor device 24 in accordance with a first embodiment of the present invention. The device 24 has a semiconductor die 26, a mounting substrate 28, and an interposer 30. The semiconductor die 26 has on its active surface 32 a plurality of bonding pads (not shown). The bonding pads can be arranged either peripherally, centrally, or as an area array, whereas the device in the prior art is limited to a peripheral bonding pad configuration. The mounting substrate 28 has a pattern of conductive traces 33 on a first or top surface and a plurality of conductive pads 31 on a second or bottom surface. The active surface 32 of the die is electrically connected to the pattern of conductive traces 33 on the top surface of the substrate 28. A plurality of conductive vias 23 enable electrical connectivity between the conductive traces 33 and conductive pads 31.

Examples of materials that can be used for the mounting substrate 28 can include, but are not limited to ceramics and polymeric materials, such as epoxy-glass cloth material, bismaleimide-triazine resin, polyimide and other printed circuit board laminate materials. Other insulating materials may also be suitable for the substrate. The conductive traces 33, the conductive pads 31, and the conductive vias 23 on the substrate 28 are fabricated by laminating, etching, plating, printing, or any combination thereof.

As illustrated in FIG. 2, the semiconductor die 26 is coupled to the mounting substrate 28 with the interposer 30. The interposer 30 performs two functions. The interposer 30 replaces the die-attach epoxy as used in the prior art device to affix the semiconductor die 26 to the mounting substrate 28. Additionally, the interposer 30 provides the first level of electrical interconnects between the active surface 32 of the die 26 and the conductive traces 33 on the top surface of the mounting substrate 28. Thus, the step of wire bonding is eliminated in the present invention. The interposer 30 electrically conducts only in the z-direction through the thickness of the interposer by way of an anisotropic conductive matrix. This matrix allows conductivity only in the z-axis, otherwise performing as an insulator in the other directions, namely x and y. One example of a possible material that can be used for performing the interposer function is an anisotropic conductive adhesive, which is commercially available. Other tacky polymeric materials with directionally conductive fillers may also be used. The interposer 30 should have some degree of compliancy to minimize mechanical and thermal stresses between the semiconductor die 26 and the mounting substrate 28.

An advantage to using the interposer 30 to electrically connect the semiconductor die 26 to the mounting substrate 28 over the prior art is the elimination of the epoxy die-attach and wire bonding processes. The two separate assembly processes are replaced with a single process that affixes the die to the substrate and concurrently forms the first level of interconnects. Furthermore, the attendant surface area required for wire bonding posts on the substrate is eliminated with the present invention. Thus, a reduction in substrate size is possible. Moreover, the conductive traces 33 can be routed into the center region of the mounting substrate. This area was reserved strictly for a die-attach area in the prior art configuration, which means that area could not be used for signal traces, leading to a necessarily larger substrate. Utilizing the center region of the substrate 28 for routing of signal traces in the present invention results in a smaller substrate, hence a semiconductor device having a smaller footprint. An additional advantage to the invention is that the use of an area array of interconnects on the semiconductor die, as opposed to peripheral wire bonds, provides shorter interconnects and therefore better electrical performance. The signal paths are shortened leading to reduced inductance and parasitic parameters.

Also illustrated in FIG. 2 is an overmolded resin package body 34 surrounding the semiconductor die 26 and interposer 30. The inactive surface 36 of the die 26 is exposed for enhanced thermal dissipation. The package body 36 is most conveniently formed through a conventional transfer molding process. The molded package body 34, typically a thermosetting resin compound, provides the semiconductor die 26 and interposer 30 with mechanical and environmental protection. An advantage of a molded package body is predictable and repeatable final package body dimensions. Alternatively, a glob-top process can be used to dispense a material to form a protective package body or seal around the semiconductor die and the interposer. The types of resin used in molding and glob-top or sealing processes are not critical elements of this invention. The thickness of the resin package body 34 in this embodiment is reduced from the prior art package body because wire bonds have been eliminated. In the prior art configuration, the resin package body has to be thick enough to cover the loop height of the wire bonds, whereas in the present invention, there are no wire bonds to protect. An additional advantage associated with the elimination of wire bonds from the present invention is that wire sweep or wire sway is no longer a problem. Wire sweep is a recurring problem in the molding process, especially where wire bonds are prohibitively long. The present invention bypasses the wire sweep problem altogether.

As described above, the interposer 30 electrically connects the semiconductor die 26 to the pattern of conductive traces 33 on the substrate 28. The pattern of these traces is designed to meet the electrical and thermal performance needs of the semiconductor device in conjunction with the line width and other geometrical considerations driven by the pitch requirements of the semiconductor die. The traces 33 on the top surface of the substrate are connected to conductive pads 31 on the bottom surface of the substrate with conductive vias 23 or edge wraparound structures (not shown) which are similar to half of a via structure (not shown). Conductive vias are typically plated through-holes in the case of a polymeric mounting substrate. If the substrate is a ceramic, then the conductive vias are normally metal filled with a metallized ink, such as tungsten. The conductive pads 31 are in turn connected to a printed wiring board or printed circuit board (not shown) through the use of solder balls 38. The solder balls 38 provide the second level of interconnects for the device.

Figure 3:
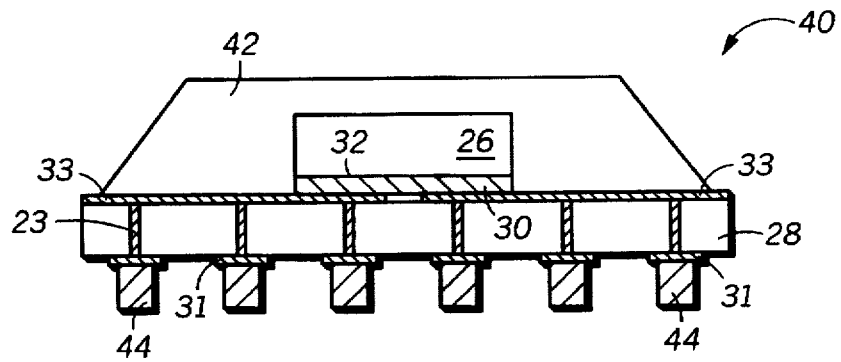
FIG. 3 illustrates, in cross-section, an alternative configuration for a semiconductor device having an interposer, in a second embodiment of the invention.

FIG. 3 illustrates, in cross-section, an alternative configuration for a semiconductor device 40, in a second embodiment of the invention. The device 40 is similar to device 24 of FIG. 2. However, the key differences are the package body configuration and the configuration of the second level of interconnects. The device 40 has a resin package body 42 that fully overmolds the semiconductor die 26. The complete coverage of the semiconductor die 26 with a resin provides additional mechanical and environmental protection for those devices that require such protection. One example of an additional protection provided by the package body 42 is that the resin used to form the package body prevents light from entering the active structures of the silicon die. Alternatively, applying a very thin coating such as paints or tapes also provides similar benefits. The second level of electrical interconnects to a board (not shown) is provide by a plurality of solder columns 44 connected to the conductive pads 31. The solder columns offer advantages in the reduction of the stress and more importantly the strain on the solder joints once the device is soldered to a board. The stress and strain are caused by temperature or power cycling of the devices and environment.

Figure 4:
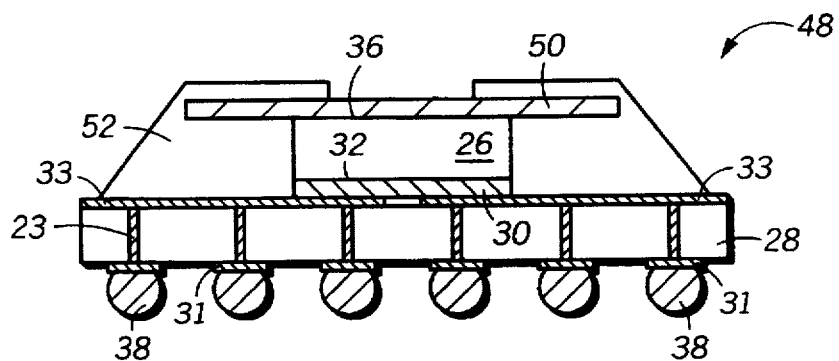
FIG. 4 illustrates, in cross-section, yet another semiconductor device configuration with an interposer and a heat spreader, in a third embodiment of the invention.

FIG. 4 illustrates, in cross-section, a semiconductor device 48 having a heat spreader 50 in direct contact with the inactive surface 36 of the semiconductor die 26, in a third embodiment of the invention. The heat spreader 50 can be attached to the inactive surface 36 of the semiconductor die 26 with a thermally conductive epoxy or a thermally conductive tape. Alternatively, the heat spreader can simply be placed in direct contact to the die 26. The molding process subsequent to attaching the heat spreader to the inactive surface of the semiconductor die serves to lock the heat spreader in place. Possible materials that can be used as a heat spreader are copper, aluminum, and aluminum nitride among others. An advantage of incorporating a heat spreader 50 into the device is the enhanced heat dissipation due to increasing the heat spreading surface area. The heat spreader 50 may be partially exposed by package body 52 as illustrated in FIG. 4. Having an exposed heat spreader surface gives the user the option of adding a heat sink which would significantly extend the device's thermal performance. Alternatively, the heat spreader 50 may be fully covered by the resin encapsulant package body. In some cases environmental conditions may dictate that the package be fully encapsulated, including the heat spreader.

Figure 5:
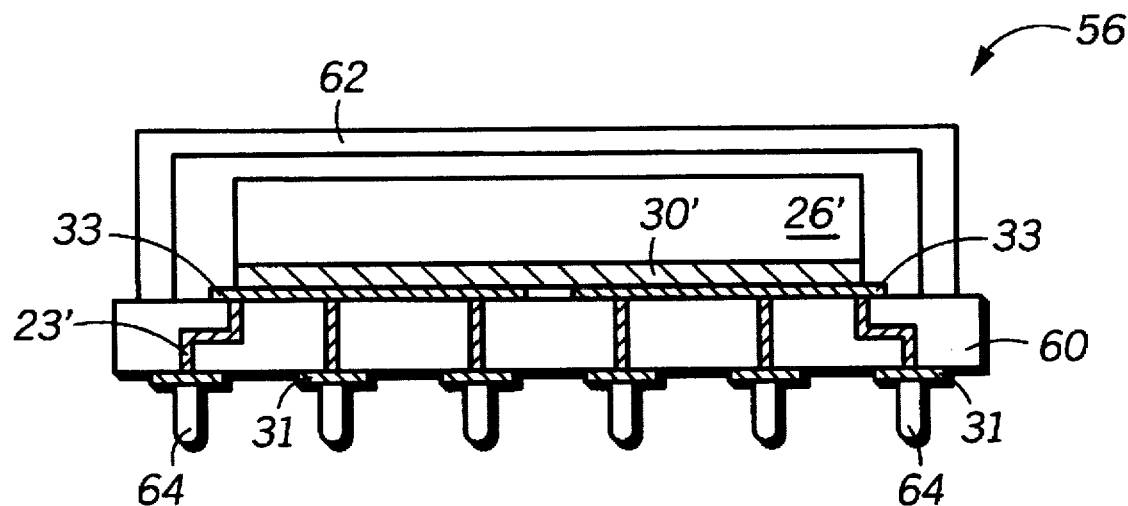
FIG. 5 illustrates, in cross-section, a capped semiconductor device having an interposer, in a fourth embodiment of the invention.

FIG. 5 illustrates, in cross-section, a capped semiconductor device 56, in accordance with a fourth embodiment of the present invention. In this embodiment, a lid 62 is used to seal the semiconductor die 26' and the interposer 30' on the top surface of a substrate 60. The lid 62 mechanically protects the semiconductor die and the first level of interconnects. The lid 62 is attached to the mounting substrate 60 using either a metallic material, such as solder, or adhesives, such as epoxies or other polymeric materials. Lid materials are usually metals; however, other materials, such as ceramics, could be used. A ceramic lid may be preferable if the substrate 60 is also a ceramic, so that minimal thermal mismatch between the lid and the substrate occurs. Furthermore, having both a ceramic substrate and a ceramic lid or a ceramic substrate and a metal lid makes hermeticity possible. Hermetic packaging is desirable in some applications where very high reliability is required. In general lid materials are chosen to have good conductivity and appropriate thermal expansions. In some cases, the environmental requirements will necessitate the use of additional sealants or encapsulation materials over the semiconductor die under the package lid 62.

In addition to what is illustrated in FIG. 5, it is also possible to attach a heat spreader to the semiconductor die 26' underneath the lid 62. To be effective, one surface of the heat spreader should be attached to semiconductor die; and another surface of the heat spreader should be in direct contact with the inside of the lid. A thermal grease or a thermally conductive epoxy can be used to attach the heat spreader to the semiconductor die and the heat spreader to the lid. Alternatively, the heat spreader could be built directly into the lid during the manufacturing process of the lid. Although lids are usually chosen so that any thermal dissipation requirements can be fully met by the lid, it may be advantageous to use the additional heat spreader in conjunction with the lid to enhance the thermal management of the device. One example of where this embodiment may be necessary is if the best material for the lid in terms of thermal matching with the substrate is insufficient to dissipate the heat from the semiconductor die, adding a highly conductive heat spreader to the lid increases the thermal dissipating capacity without sacrificing the thermal expansion matching requirement.

Also illustrated in FIG. 5 is a plurality of conductive pins 64 attached to the conductive pads 31. The pins 64 provide the second level of interconnects for the device 56. Pins are normally metals such a copper or alloy 42 with appropriate plating to enhance appearance and solderability.

Figure 6:
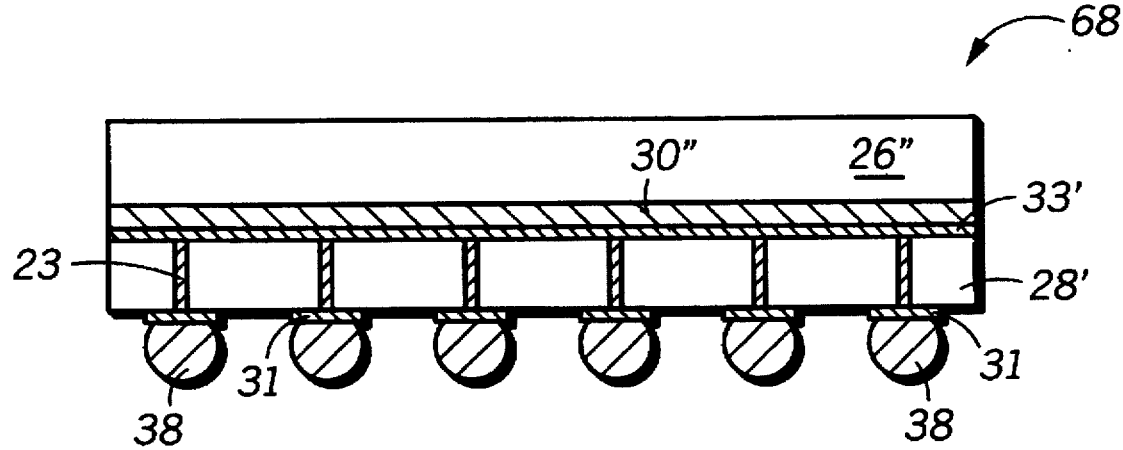
FIG. 6 illustrates, in cross-section, a die-size semiconductor device having an interposer, in a fifth embodiment of the invention.

FIG. 6 illustrates, in cross-section, a die-size semiconductor device 68, in accordance with a fifth embodiment of the invention. In this embodiment, the ability to route the traces 33' on the substrate 28' and place vias 23 under the die 26" and interposer 30" is utilized to create a minimum size package with the same footprint as the die. The interposer 30" is substantially the same size as the semiconductor die 26" and substrate 28'. Interposer 30" should be a compliant material that contains a matrix of z-axis conductors, such that electrical conductivity is limited to the z-direction through the thickness of the interposer. The interposer 30" either provides sufficient environmental protection or a separate edge sealing operation is performed. For example, the edge sealing operation can be performed after the device is mounted to a board (not shown) using a glob-top process. The major advantage to this design is the smaller footprint of the package. This embodiment is especially advantageous if board space is limited and the semiconductor die itself is large. An additional advantage includes lower cost due to the elimination of the molding process.

Figure 7:
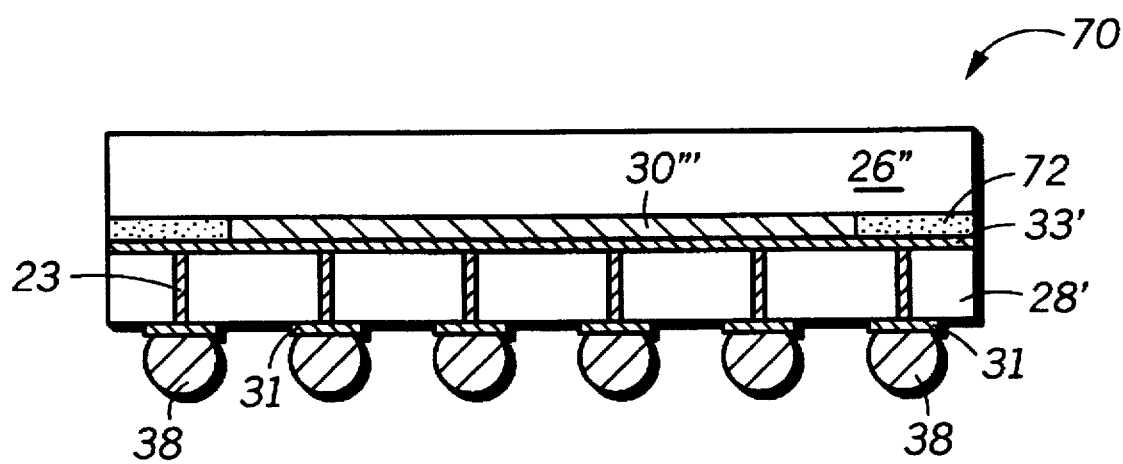
FIG. 7 illustrates, in cross-section, yet another die-size semiconductor device configuration having an interposer, in a sixth embodiment of the invention.

FIG. 7 illustrates, in cross-section, yet another die-size semiconductor device 70, in accordance with a sixth embodiment of the invention. The interposer 30'" in this configuration is illustrated to be smaller in size than the semiconductor die 26" to provide an area for the fillet of a sealant 72. The sealant 72 is an insulative material, such as a nonconductive epoxy. The sealant 72 surrounds the perimeter of the interposer 30'" to further secure the semiconductor die 26" to the substrate 28'. The sealant 72 also provides additional environmental protection to the device over that provided by the interposer. Furthermore, mechanical features, such as machined grooves, may be applied to the semiconductor die 26" or substrate 28' to provide additional locking and enhancement of the seal. Additionally, chemical treatments, such as etching, may also be performed on the die 26" or substrate 28' for the same reasons.

The foregoing description and illustrations contained herein demonstrate many of the advantages associated with the present invention. In particular, it has been revealed that a low profile semiconductor device and a method for making the same is manufacturable through the use of an interposer. The interposer, used as the first level of interconnects performs two functions: attachment of the semiconductor die to a mounting substrate and concurrent electrical connections between the die and the substrate. Moreover, embodiments of the invention allows efficient thermal dissipation through the exposed inactive surface of the die or through the use of a heat spreader. Yet another advantage is that the present invention reduces the overall thickness and footprint of the semiconductor device by the elimination of the wire bond loop height and wire bond placement region on the substrate. In addition, the area of the substrate directly underneath the die can be used for routing necessary traces for interconnections. Additionally, the present invention provides an easier manufacturing process than direct chip attach, while allowing a die-size packaged device.

Thus it is apparent that there has been provided, in accordance with the invention, a low profile semiconductor device and a method for making the same that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the interposer may provide sufficient sealing and mechanical strength in some instances so that additional sealing or molding or capping will be unnecessary. In addition, the invention is not limited to any type of semiconductor die or integrated circuit. It is also important to note that the present invention is not limited in any way to the size of a semiconductor die or the number of inputs/outputs (I/Os) of that die. Therefore, it is intended that this invention encompass all such variations and modifications failing within the scope of the appended claims.

We claim:

1. A low profile semiconductor device comprising:
    a mounting substrate having a pattern of conductive traces on a first surface and a plurality of conductive pads on a second surface, the plurality of conductive pads being electrically connected to the pattern of conductive traces;

semiconductor die having a plurality of bonding pads disposed in an area array on an active surface of the semiconductor die, wherein the semiconductor die and the mounting substrate are substantially of a same width and length, the semiconductor die being mounted to the first surface;

a compliant interposer coupling the plurality of bonding pads on the active surface of the semiconductor die to the pattern of conductive traces on the first surface of the mounting substrate, wherein the interposer provides a first level of interconnects between the semiconductor die and the pattern of conductive traces; and a plurality of external electrical connections connected to the plurality of conductive pads on the second surface of the mounting substrate.

2. The device according to claim 1, wherein the interposer is smaller in width and length than the semiconductor die and the mounting substrate, the device further comprising an insulative epoxy sealant mound a perimeter of the interposer to provide mechanical and environmental protection for the device.

3. The device according to claim 1, wherein the plurality of external electrical connections is selected from a group consisting of: solder balls, solder columns, conductive polymer balls, and pins.

* * * * *